United States Patent
Di Sessa et al.

(10) Patent No.: US 10,890,996 B2
(45) Date of Patent: Jan. 12, 2021

(54) TRANSPARENT DISPLAYS WITH CAPACITIVE TOUCH

(71) Applicant: Azena Medical, LLC, Walnut Creek, CA (US)

(72) Inventors: Alexandre B. Di Sessa, Walnut Creek, CA (US); Roberto Minoru Imai, Jr., Dublin, CA (US)

(73) Assignee: Azena Medical, LLC, Walnut Creek, CA (US)

( * ) Notice: Subject to any disclaimer, the term of this patent is extended or adjusted under 35 U.S.C. 154(b) by 0 days.

(21) Appl. No.: 16/427,126

(22) Filed: May 30, 2019

(65) Prior Publication Data

US 2020/0379592 A1 Dec. 3, 2020

(51) Int. Cl.
*G06F 3/041* (2006.01)
*G06F 3/044* (2006.01)
*G09G 3/20* (2006.01)
*G09G 3/30* (2006.01)

(52) U.S. Cl.
CPC .......... *G06F 3/0412* (2013.01); *G06F 3/0443* (2019.05); *G09G 3/2007* (2013.01); *G09G 3/30* (2013.01); *G09G 2360/02* (2013.01)

(58) Field of Classification Search
CPC .. G06F 3/0412; G06F 3/0443; G09G 2360/02
See application file for complete search history.

(56) References Cited

U.S. PATENT DOCUMENTS

| 10,304,374 B2 | 5/2019 | Di Sessa et al. |
| 2004/0070195 A1* | 4/2004 | Nelson .................. B42D 3/123 283/83 |
| 2008/0276192 A1 | 11/2008 | Jones et al. |
| 2009/0225060 A1* | 9/2009 | Rizoiu ................. A61C 1/0046 345/176 |
| 2009/0292168 A1 | 11/2009 | Farr |
| 2010/0299978 A1 | 12/2010 | Werners et al. |
| 2011/0139851 A1 | 6/2011 | McCuen |
| 2015/0230865 A1 | 8/2015 | Sivriver et al. |
| 2017/0148378 A1 | 5/2017 | Di Sessa et al. |
| 2019/0336243 A1 | 11/2019 | Di Sessa et al. |

* cited by examiner

*Primary Examiner* — Kenneth B Lee, Jr.
(74) *Attorney, Agent, or Firm* — Carr & Ferrell LLP

(57) ABSTRACT

Transparent displays with capacitive touch are disclosed herein. Some embodiments include a rear transparent layer having light emitting elements, an intermediate transparent structural layer disposed on the rear transparent layer, a top transparent layer having capacitive touch elements that receive touch input, and a microprocessor that receives the touch input from the capacitive touch elements and controls illumination of the light emitting elements in response to the touch input, the microprocessor being configured to use a pulse skipping scheme applied to control illumination of the light emitting elements.

20 Claims, 9 Drawing Sheets

```
for (int a=0;a<36;a++) // We only use 36 of the 40 available
channels on each EL driver chip
{
  if (a==0)
  {
    ClearPulse();
    DATARESET_1; // if it is the first pulse, we set data pin to let
it scan through the 40 channels
  }
  CLOCK_1;
  if (firstcycle)
  {
    if (a%2==0) // First cycle has positive pulses on even row
    {
      PositivePulse();
    }
    else
    {
      NegativePulse();
    }
  }
  else
  {
    if (a%2==0) // Second cycle has negative pulses on even row
    {
      NegativePulse();
    }
    else
    {
      PositivePulse();
    }
  }
  CLOCK_0;
  DATARESET_0;
  // For each loop, we send one clock pulse to move the data bit
through each channel.
}
for (int a=0;a<4;a++) // Clock through the remaining channels
{
  CLOCK_1;
  CLOCK_0;
}
if (firstcycle)
{
  firstcycle=false;
}
else
{
  firstcycle=true;
  dimcycle++;
}
if (dimcycle==6 ) dimcycle=0; // We only send pulses to dimmed
channels every 6 cycles.
```

*FIG. 4*

TRANSPARENT DISPLAYS WITH CAPACITIVE TOUCH

CROSS REFERENCE TO RELATED APPLICATIONS

N/A

FIELD OF THE INVENTION

The present technology is directed to display devices, and more particularly, but not by limitation, to transparent electroluminescent displays having capacitive touch capabilities. Some embodiments comprise multilayer configurations with light emitting elements within one layer and capacitive touch elements embedded in a separate layer.

SUMMARY

According to some embodiments, the present disclosure is directed to a transparent electroluminescent display, comprising: a first transparent layer comprising a first plurality of rows of traces, the first plurality of rows of traces coupled with light emitting elements, at least a portion of the light emitting elements being associated with control objects that allow a user to select operational settings for an associated device; a second transparent layer comprising capacitive touch elements that receive touch input from a user, the capacitive touch elements being associated with the control objects; and a third transparent structural layer disposed between the first transparent layer and the second transparent layer.

According to some embodiments, the present disclosure is directed to a transparent electroluminescent display, comprising: a first transparent layer comprising a first plurality of rows of traces coupled with light emitting elements; a second transparent layer comprising a second plurality of rows of traces associated with capacitive touch elements embedded into the second transparent layer; and a microprocessor configured to control the illumination of the light emitting elements using a pulse skipping scheme applied to the first plurality of rows of traces so as to selectively illuminate the light emitting elements, based on touch input received from the capacitive touch elements of the second transparent layer.

According to some embodiments, the present disclosure is directed to a transparent electroluminescent display, comprising a rear transparent layer comprising light emitting elements; an intermediate transparent structural layer disposed on the rear transparent layer; a top transparent layer comprising capacitive touch elements that receive touch input; and a first microprocessor that receives the touch input from the capacitive touch elements and controls illumination of the light emitting elements in response to the touch input, and a second microprocessor that is configured to use a pulse skipping scheme applied to control illumination of the light emitting elements.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

FIG. 4 illustrates example code for controlling light emitting elements using a pulse skipping scheme.

DETAILED DESCRIPTION

Generally, the present disclosure describes transparent electroluminescent displays that incorporate capacitive touch elements. The capacitive touch elements can be used to selectively control illumination of light emitting elements and/or device operations associated therewith. In some embodiments, the capacitive touch elements are embedded into one layer of a multilayer transparent electroluminescent display, while the light emitting elements are embedded into a lower or subordinate layer below the layer comprising the capacitive touch elements. In some embodiments, these two layers are separated by a structural layer. In various embodiments, each of the layers is created from a glass substrate, which are placed in a laminated configuration.

Figure 1A:
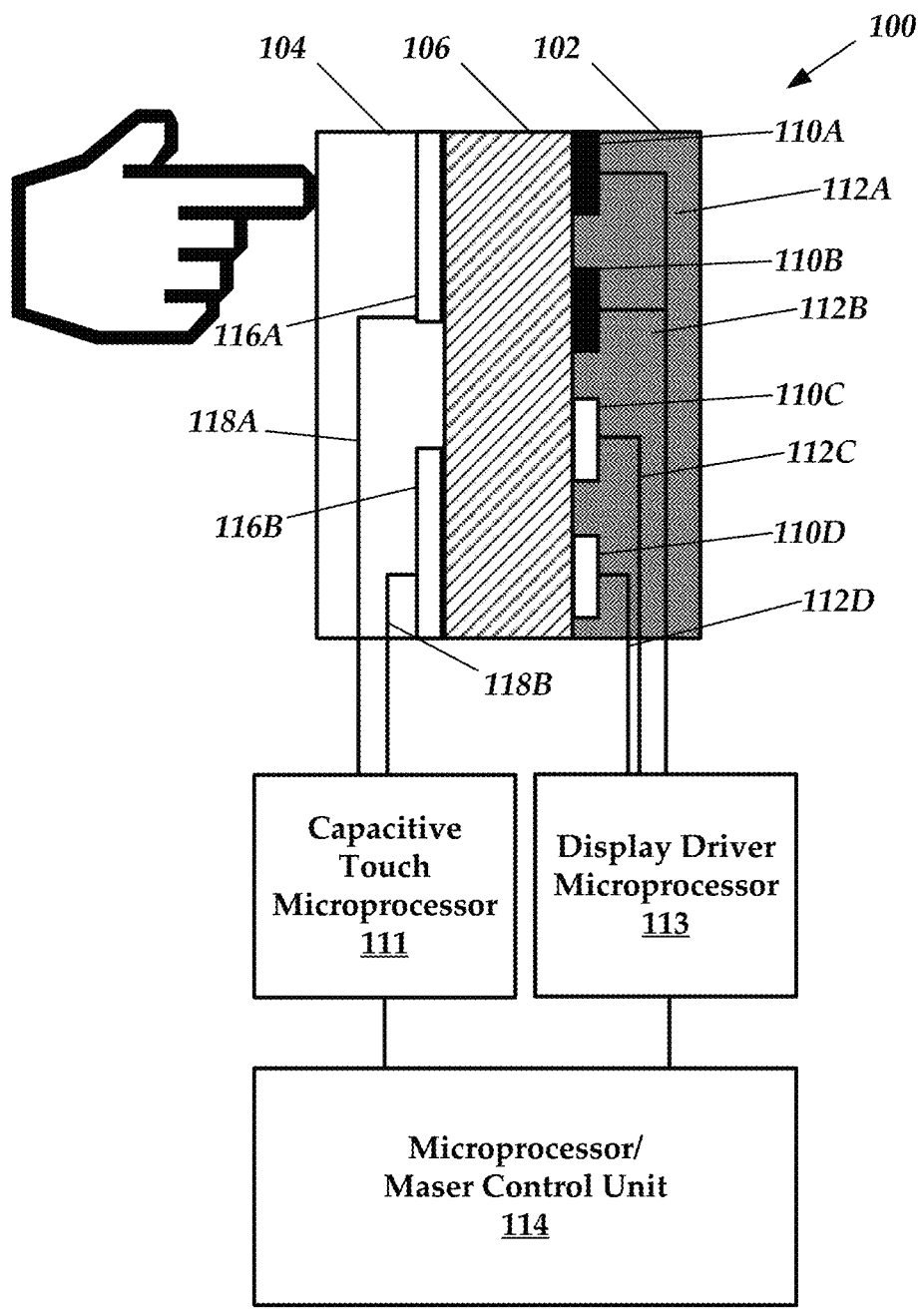
FIG. 1A is a partial cross-sectional view of an example transparent electroluminescent display with capacitive touch, constructed in accordance with the present disclosure.

FIG. 1A is a partial cross-sectional view of an example transparent electroluminescent display with capacitive touch (hereinafter display 100), constructed in accordance with the present disclosure. The display 100 comprises a plurality of layers such as a first transparent layer 102 (also referred to as a rear layer), a second transparent layer 104 (also referred to as a top layer), and a third transparent layer 106 (also referred to as an intermediate layer or structural layer). While three layers are illustrated, it will be understood that additional or fewer layers may be present in other displays constructed in accordance with the present disclosure.

The first transparent layer 102 is a glass substrate that comprises plurality of light emitting elements such as light emitting elements 110A-110D, which are each associated with a trace, to create a plurality of rows of traces 112A-112D. For example, light emitting element 110A is associated with the trace 112A. The plurality of rows of traces 112A-112D electrically couple the light emitting elements 110A-110D with a microprocessor (also referred to as a master control unit 114). In general, a "light emitting element" refers to a terminal portion of a trace that comprises the luminescent material, such as phosphor or a thin metal coating. The light emitting elements of the first transparent layer 102 can include a thin film, less than a micron thick, of specially designed electroluminescent phosphor. Additional details regarding the manufacture, operation, and use of the first transparent layer 102 are provided in greater detail infra with reference to FIGS. 2-6.

In some embodiments, the display 100 also comprises a capacitive touch microprocessor 111 and a display driver microprocessor 113. In various embodiments, the functionalities of the capacitive touch microprocessor 111 and the display driver microprocessor 113 are controlled by the master control unit 114. In general, the capacitive touch microprocessor 111 is coupled with and controls the capacitive touch elements, while the display driver microprocessor 113 couples with and controls the light emitting elements as will be described herein. To be sure, while some embodiments include the capacitive touch microprocessor 111 and the display driver microprocessor 113 other embodiments can be controlled through a single microprocessor that is configured to control both the capacitive touch elements and the light emitting elements. Thus, some embodiments may refer generally to a microprocessor, which could include the capacitive touch microprocessor 111, the display driver microprocessor 113, or the master control unit 114. In some embodiments, master control unit 114 can control the display driver microprocessor 113 to illuminate characters of the display 100 based on input to a control panel (see FIG. 7). The master control unit 114 can also control illumination of characters of the display 100 in response to capacitive touch input received by the capacitive touch microprocessor 111.

Figure 1B:
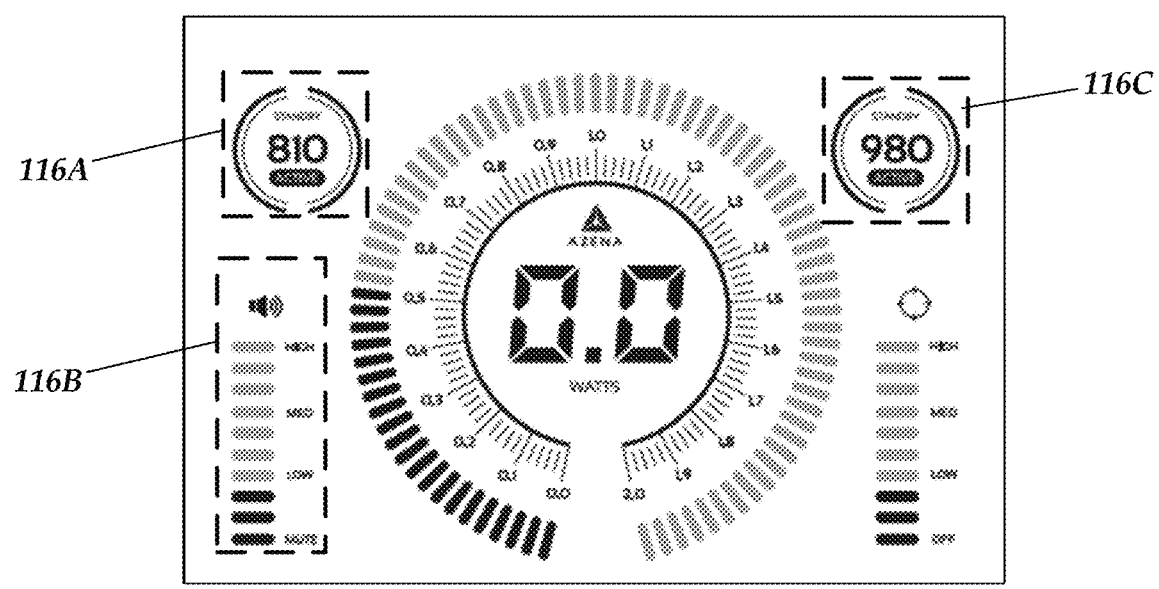
FIG. 1B is a view of an example first transparent layer of the transparent electroluminescent display of FIG. 1A, illustrating light emitting elements arranged as a user interface and corresponding capacitive touch elements.

The second transparent layer 104 is also a glass substrate that comprises (e.g., has embedded therein) capacitive touch elements, such as capacitive touch element 116A and 116B. Additional capacitive touch elements such as capacitive touch element 116C are illustrated in FIG. 1B. Each of the capacitive touch elements can be coupled with a trace. For example, capacitive touch element 116A couples with the capacitive touch microprocessor 111 through trace 118A, while capacitive touch element 116B couples with the capacitive touch microprocessor 111 through trace 118B. Any suitable method for creating these traces that would be known to one or ordinary skill in the art can be used. The traces used to couple the capacitive touch elements to the capacitive touch microprocessor 111 can be created through deposition a material such as indium tin oxide or other conductive material onto the glass substrate of the second transparent layer 104, or through any other suitable means.

In general, touch input is received by one or more of the capacitive touch elements. In response, the display driver microprocessor 113 controls illuminance of the one or more of the light emitting elements (and in some embodiments operational characteristics of an associated device). In this example, a user is touching the capacitive touch element 116A, which causes the display driver microprocessor 113 to send pulses to the light emitting elements 110A and 110E to selectively illuminate the light emitting elements 110A and 110B. Additional details on methods for how the display driver microprocessor 113 sends pulses to the light emitting elements are provided infra. In general, these methods include using pulse skipping schemes in some embodiments to dim light emitting elements in portions of the first transparent layer 102 that are not needed.

According to some embodiments, capacitive touch elements are associated with light emitting elements, as illustrated in FIG. 1B. In FIG. 1B, the capacitive touch element 116A is illustrated as being associated with light emitting elements 110A. In general, the capacitive touch elements are illustrated in dotted line. The combination of one or more capacitive touch elements with one or more light emitting elements are used to indicate a control object. The control objects can be used to select operational setting for an associated device (see FIG. 7 as an example). To be sure, the light emitting elements are arranged so as to display, for example, an operational setting for an associated device. Examples of associated devices are described with reference to FIG. 7, but in general, the associate device could include a laser emitting medial apparats used for various medical and/or dental applications.

It will be understood that the transparent displays of the present disclosure need not be coupled with an associated device, but can be used independently as a standalone display device. That is, a transparent layer with capacitive touch elements is used to control another transparent layer with light emitting elements using a microprocessor as disclosed herein. In some embodiments, the transparent layers are provided in a laminate or stacked form. In other embodiments, the transparent layers can be separated from one another, but still work in combination through connection to a common microprocessor or collection of microprocessors using a common bus or printed circuit board (PCB).

In some embodiments, the capacitive touch element 116A is associated with light emitting elements 110A. When the capacitive touch element 116A is selected, the display driver microprocessor 113 controls the light emitting elements 110A to illuminate the wavelength selection (e.g., 810 nanometers). A similar arrangement is provided between the capacitive touch element 116B and the light emitting elements 110B, which collectively allow for selection of a different preset wavelength selection for a laser device (e.g., 980 nanometers). In some embodiments, both wavelength selections can be made in combination.

The capacitive touch element 116C and corresponding light emitting elements 110C are used to select and display audio settings the device. In this example, the capacitive touch element 116C allows for swiping gestures. As the user swipes vertically, the microprocessor 114 selectively controls the light emitting elements 110C in accordance with the swipe gesture received. As the user drags their finger upwardly across the capacitive touch element 116C, light emitting elements 110C are illuminated by the display driver microprocessor 113. Again, the selective illumination of the light emitting elements 110C is controlled using a pulse skipping scheme, for example.

In general, a capacitive touch element can include any suitable device that can receive touch input from a user using capacitive sensing. In one embodiment, a capacitive touch element includes a transparent Indium Thin Oxide (ITO) element. The capacitive touch element can comprise any suitable capacitive element such as carbon nanotubes, conductive ink, or other thin metallic film.

In some embodiments, the capacitive touch elements integrated into the display 100 can be controlled using a separate capacitive touch controller and the light emitting elements are controlled by one or more specific purpose microprocessors. In some embodiments, the functions for the capacitive touch elements and the light emitting elements are controlled using a single multi-purpose microprocessor, such as the microprocessor 114.

Figure 2:
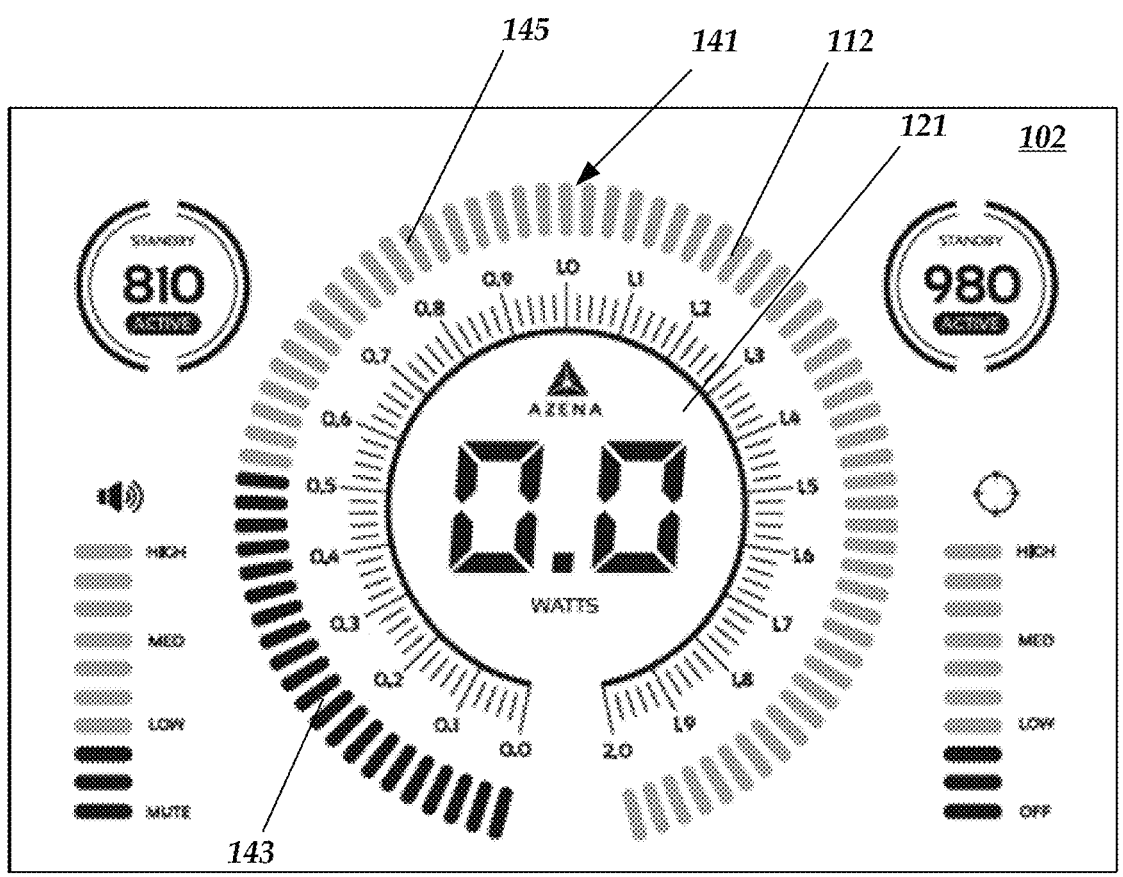
FIG. 2 is a close up view of an example first transparent layer of the transparent electroluminescent display of FIG. 1B, illustrating light emitting elements arranged as a user interface.

Referring now to FIGS. 1A-2 collectively, in some embodiments, the first transparent layer 102 comprises a unique transparent electroluminescent area that can provide extremely high resolution viewing angles from up to 170 degrees of field of view. The first transparent layer 102 in some embodiments comprises a substrate material having over 80% transparency and an arched configuration of 32 degrees for optimal viewing angle from any direction (other configurations are also likewise contemplated). The light emitting elements of the first transparent layer 102 include a thin film, less than a micron thick, of specially designed electroluminescent phosphor, which is described in greater detail with respect to FIG. 3. The film is shaped as desired to form objects such as hash marks, circles, numbers or other characters.

Figure 7:
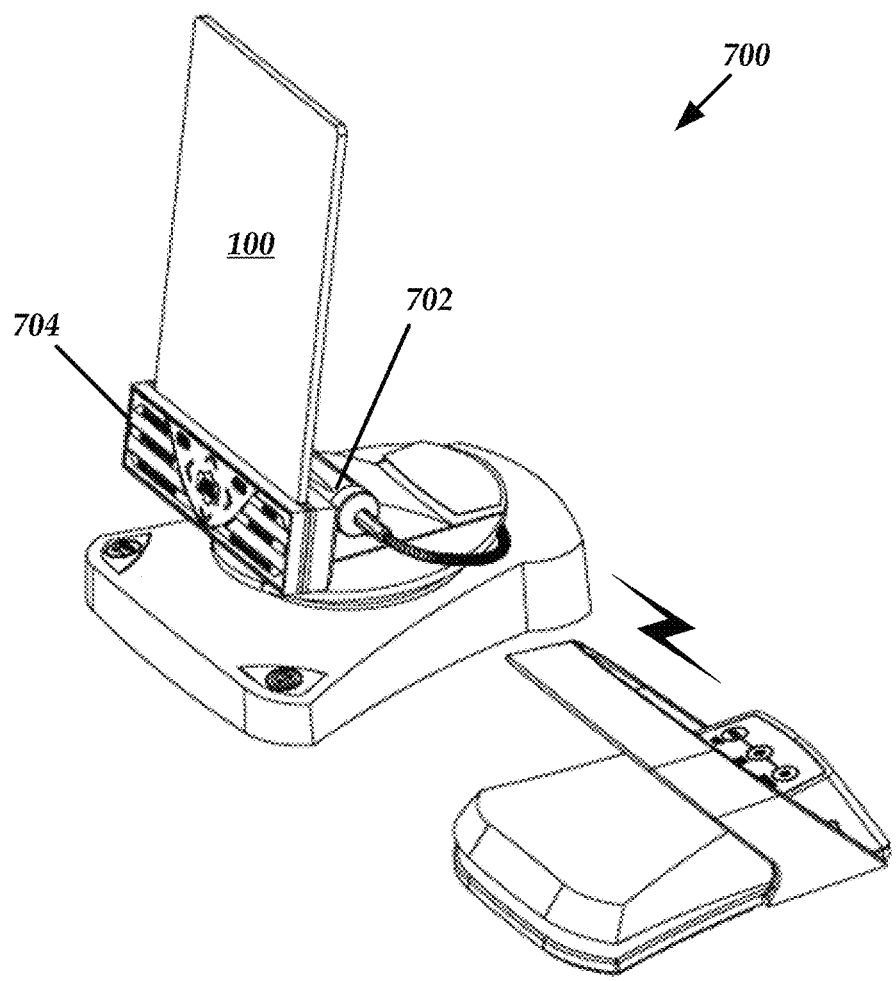
FIG. 7 is a perspective view of an example additional device that can be utilized and/or controlled using the transparent displays with capacitive touch of the present disclosure.

In some embodiments, a user can manually select a power or operational level (using a control panel as illustrated in FIG. 7) rather than selecting a listed operational mode by tapping or otherwise touching a power indicator dial 112. In some embodiments, the power indicator dial 112 can be controlled using another capacitive touch element.

In some embodiments, the first transparent layer 102 (and specifically the plurality of light emitting elements thereof) is controlled by one or more microprocessors (such as microprocessor 114) that control various light emitting elements of the first transparent layer 102. In some embodiments, the master control unit 114 can selectively dim portions of the light emitting elements of the first transparent layer 102 to indicate a power level on the power indicator dial 112, using the display driver microprocessor 113. For example, a portion of the power indicator dial increments, such as increment 141 are illuminated to a greater extent than remaining increments. The power level is displayed in a central numerical power level value 121 portion of first transparent layer 102.

As background, first transparent layer 102 and display driver microprocessor 113 use AC current to light up specific light emitting elements. When a light emitting element is pulsed, it becomes visible and user can interact with it. However, when user interaction is made with a particular display object, it is difficult to visualize selections or change in settings on the display 100.

In order to make the process simpler and easier for the user to make selections and interact with the display 100, the present disclosure provides methods of diming a particular segment having one or more light emitting elements. By dimming one or more light emitting elements while simultaneously brightening other light emitting elements, light intensity (e.g. luminance) can be selectively changed and the user can visually apprehend the change.

In FIG. 2, characters or facets, such as increments, of a user interface displayed on the first transparent layer 102 that are black (indicating full brightness) and some that are light gray (dimmed). That is, light emitting elements are arranged to create a display for a user interface. The arch reflects a change when user selects an option to increase power where the light emitting elements changes from dimmer to full brightness, demonstrating to the user this particular selection was made. The central numerical power level value 121 portion of the display 100 is located within the power indicator dial 112. The power indicator dial 112 comprises power indicator dial increments 141 that ring the central numerical power level value 121. Portions of the power indicator dial increments 141, such as portion 143, can be illuminated at a power level that is greater than a power level used to illuminate portion 145 of the power indicator dial increments 141.

Electroluminescent technology uses an AC form of energy that is applied to the light emitting elements to produce light. The master control unit 114 controls the display driver microprocessor 113 for the first transparent layer 102 to apply a positive and negative pulse at a specific voltage, at a certain frequency, which causes one or more light emitting elements to be illuminated. Each pulse can be delivered at a certain pulse width, but the total period of the positive and negative pulse can be adjusted. In some embodiments, increasing or decreasing the total period of the pulses, changes the frequency and causes the light emitting elements to be brighter or dimmer (a differential change in luminance).

The master control unit 114 controls the display driver microprocessor 113 to change dimming on each light emitting element by increasing or decreasing a frequency of energy pulsing through a pulse skipping scheme. The pulse skipping scheme allows for pulses to be skipped in the subsequent cycles, which in turn changes the frequency of energy pulses resulting in light emitting elements being dimmer as more pulses are skipped.

Stated otherwise, the master control unit 114 causes illumination of light emitting elements integrated into the first transparent layer 102 that provide light to the power indicator dial 112, as well as other display features. In order to provide dimming of these light emitting elements in the sectors, the display driver microprocessor 113 can be configured to skip or pulse power to light emitting elements that are selected for dimming relative to the light emitting elements that are selected to be illuminated. It will be understood that the display driver microprocessor 113 can address individual light emitting elements, which function similarly to a pixel of a video display. Thus, each light emitting element can be addressed using a channel. The display driver microprocessor 113 can pulse energy to individual light emitting elements using these dedicated channels. The channels can also be referred to as an electrical trace. The traces extend in vertical lines within the first transparent layer 102 as discussed above. Again, in some embodiments multiple microprocessors can be utilized to distribute the processing load required to control the various light emitting elements across the first transparent layer 102.

The display driver microprocessor 113 can be configured to maintain an energy pulse rate for the light emitting elements that are selected to be illuminated and then pulse the light emitting elements that are selected to be dimmed on a schedule, such as only every sixth cycle. One of ordinary skill in the art will appreciate that other pulse schedules and cycles can be utilized based on the desired luminescence differential between illuminated light emitting elements and dimmed light emitting elements. Example code/instructions that can be executed by the microprocessors for the first transparent layer 102 to selectively dim the first transparent layer 102 are found in FIG. 4.

Figure 3:
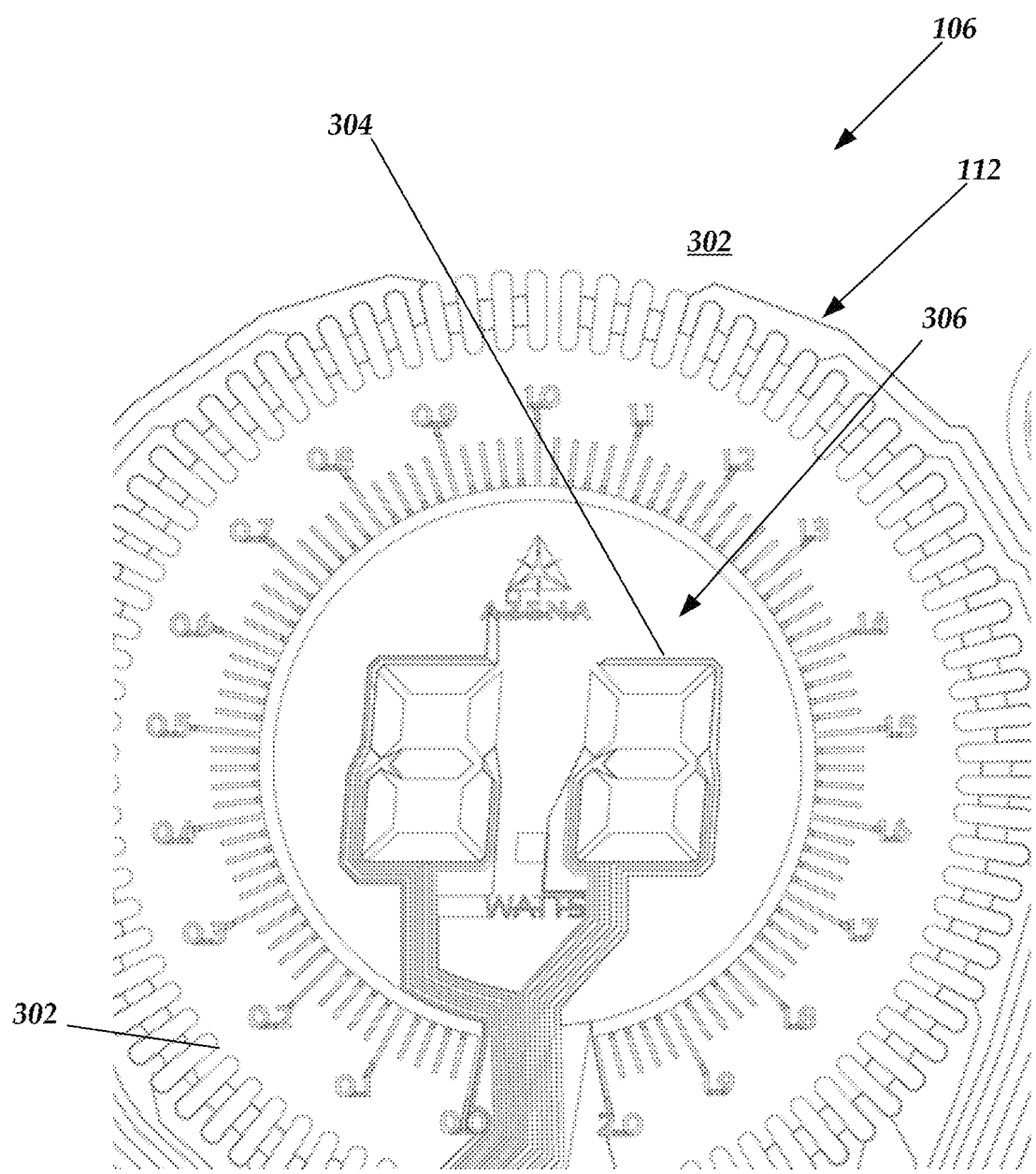
FIG. 3 illustrates a portion of the first transparent layer having traces and light emitting elements.

FIG. 3 illustrates a section of the electroluminescent display 108. In one embodiment, the first transparent layer 102 is constructed from a glass substrate 302. To create luminescent segments (a trace in combination with at least one light emitting element) a plurality of trace lines, such as trace line 304 are formed on the electroluminescent display 108 through deposition a material such as indium tin oxide or other conductive material. The traces can be formed by masking of the glass substrate 302 to create GUI elements, such as the power indicator dial 112 or other characters/icons that are to be illuminated. In some embodiments, portions of the traces that correspond to the characters/icons are coated with a material that illuminates when an electrical charge is applied. For example, the trace lines that form the power level digits 306 are covered or coated with phosphor compound. When an electrical charge is applied to the traces by the microprocessors the phosphor produces light. A similar process can be used to create the traces for the capacitive touch elements incorporated into the second transparent layer 104.

Figure 5:
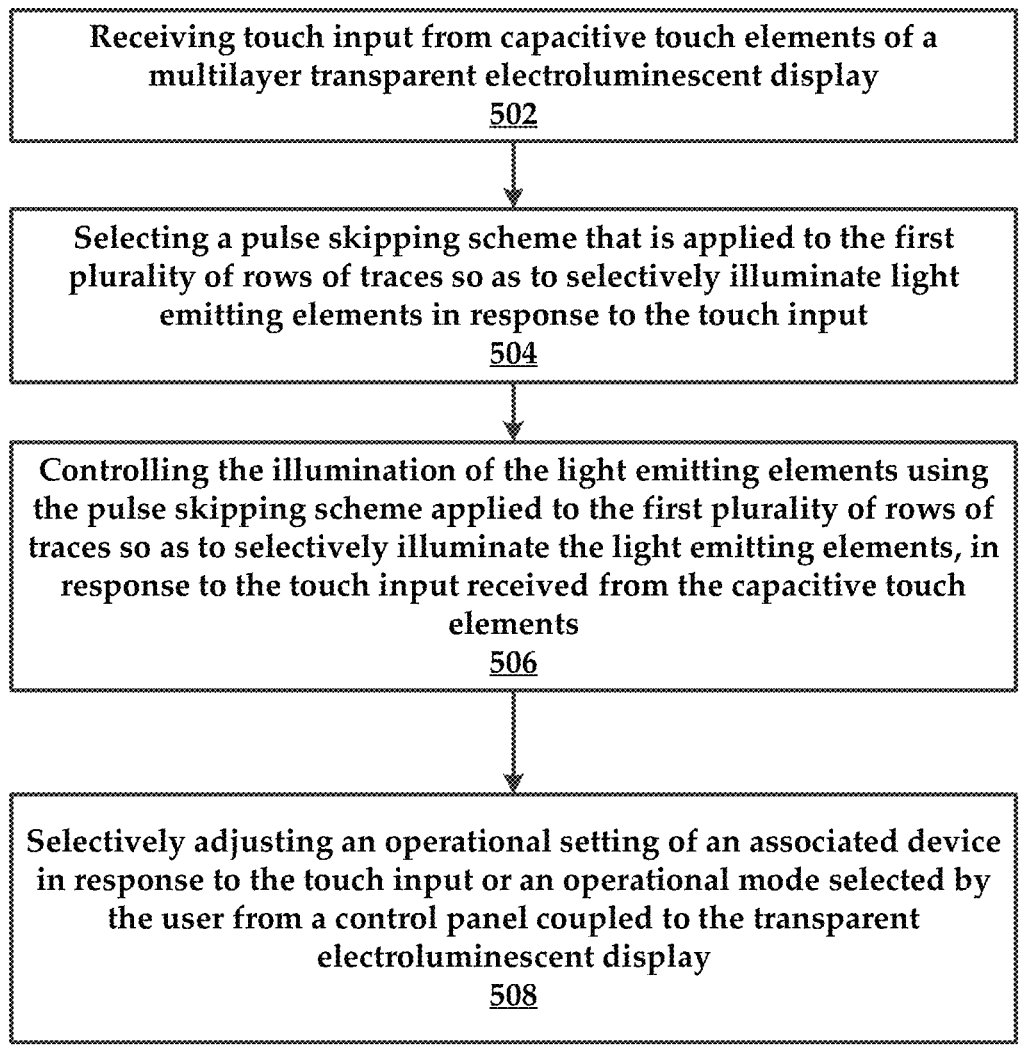
FIG. 5 is a flowchart of an example method of controlling a transparent display of the present disclosure.

FIG. 5 is a flowchart of an example method of the present disclosure for controlling a transparent electroluminescent display with capacitive touch. In some embodiments, the method includes a step 502 of receiving touch input from capacitive touch elements. The capacitive touch elements are disposed on one layer of a multilayer display. Next, the method includes a step 504 of selecting a pulse skipping scheme that is applied to the first plurality of rows of traces so as to selectively illuminate light emitting elements. The light emitting elements are disposed on or within a separate transparent layer of the multilayer display. The selection of the pulse skipping scheme is based on the touch input receive. For example, the user may touch a capacitive touch element associated with a control object, such as a wavelength selector. Based on this touch input, a pulse skipping scheme is selected that allows the light emitting elements associated with the capacitive touch elements to be illuminated.

Thus, the method includes a step 506 of controlling the illumination of the light emitting elements using the pulse skipping scheme applied to the first plurality of rows of traces so as to selectively illuminate the light emitting elements, in response to the touch input received from the capacitive touch elements.

In one or more embodiments, the method can include a step 508 of selectively adjusting an operational setting of an associated device in response to the touch input or an operational mode selected by the user from a control panel coupled to the transparent electroluminescent display. For example, a wavelength for a laser can be adjusted based on the touch input selection received from the capacitive touch elements. In sum, the luminance of the light emitting elements is selected and a corresponding operational setting is selected for an associated device. To be sure, not all embodiments include an associated device. Thus, the capacitive touch elements can be used to only control selective luminance of light emitting elements in a display.

Figure 6:
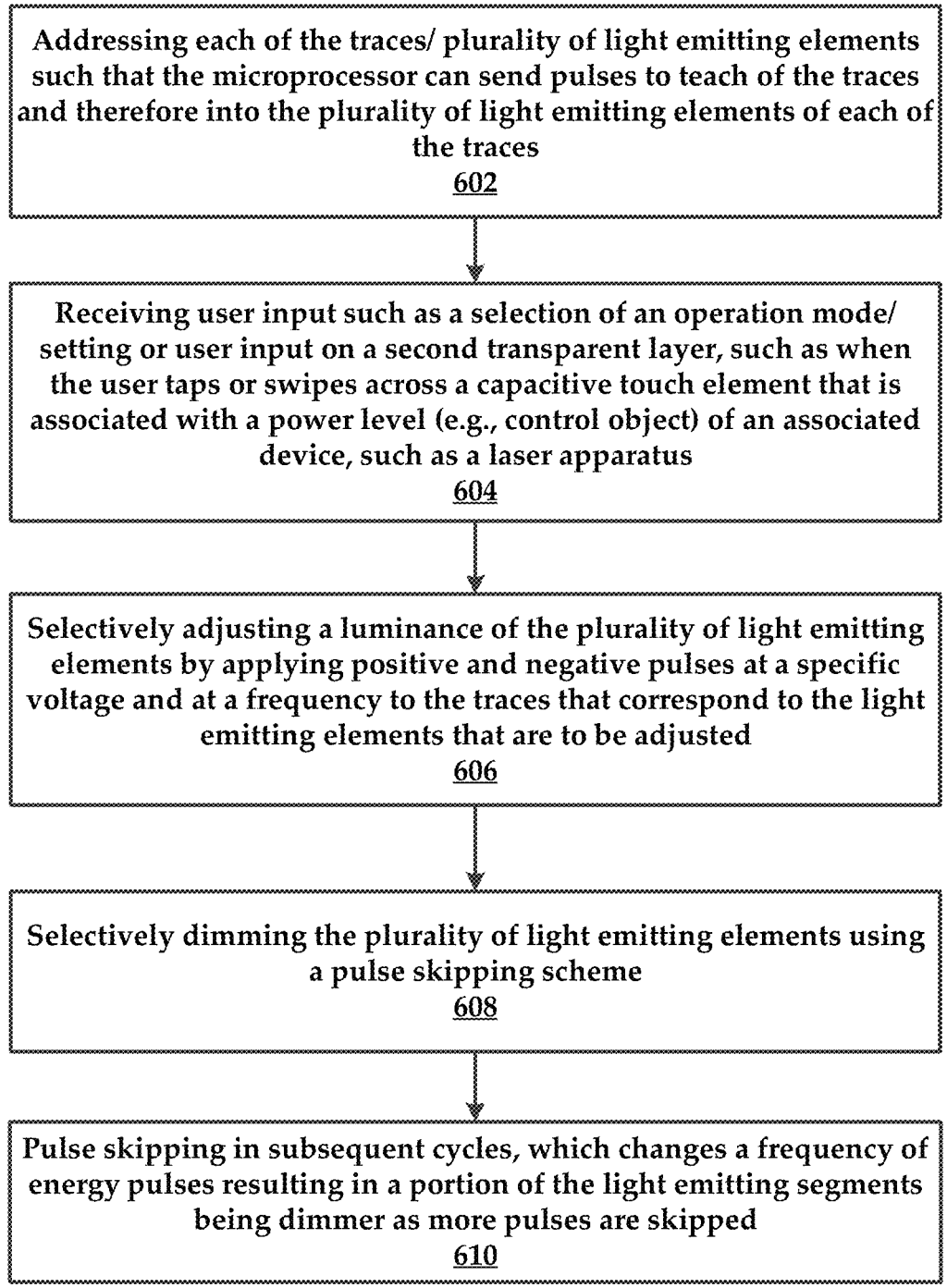
FIG. 6 is a flowchart of another example method of controlling a transparent display of the present disclosure.

FIG. 6 is a flowchart of an example method for controlling an electroluminescent display, such as the first transparent layer 102 of FIG. 1. For context, the first transparent layer is comprised of a plurality of light emitting elements. In some embodiments groups of light emitting elements are arranged in lines within the first transparent layer. These lines form characters, icons, or other representations of the display. The light emitting elements comprise portions of the traces that have a luminescent coating (such as phosphor). In some embodiments, each of the traces is addressed to a microprocessor.

For context, the light emitting elements are controlled in response to touch input that is received through one or more capacitive touch elements disposed on or within a transparent layer that is separate from the first transparent layer that embeds or otherwise comprises the light emitting elements. In one embodiment, the method comprises a step 602 of addressing each of the traces such that the microprocessor can send pulses to each of the traces and therefore into the plurality of light emitting elements of each of the individual traces.

The method comprises a step 604 of receiving user input such as a selection of an operation mode/setting or user input on a second transparent layer, such as when the user taps or swipes across a capacitive touch element that is associated with a power level (e.g., control object) of an associated device, such as a laser apparatus.

In one embodiment, the method includes a step 606 of selectively adjusting a luminance of the plurality of light emitting elements by applying positive and negative pulses at a specific voltage and at a frequency to the traces that correspond to the light emitting elements that are to be adjusted. As mentioned above, the positive and negative pulses have a selected pulse width, further wherein a length of the positive and negative pulses are selectively adjusted by the microprocessor.

In some embodiments, the positive and negative pulses of electrical energy have a fixed pulse width and an adjustable frequency. In one or more embodiments, a period of the positive and negative pulses is selectively controlled by a microprocessor, which effectively changes the frequency of the electrical energy pulses.

The method includes a step 608 of selectively dimming the plurality of light emitting elements using a pulse skipping scheme. This selective dimming allows for portions of the light emitting elements to be illuminated while other portions of the light emitting elements are illuminated less or not at all. Again, the power level for a portion of the light emitting elements is set at a first luminance level, while other light emitting elements are not illuminated or are illuminated with a second luminance level that is less than the first luminance level. According to some embodiments, the method includes a step 610 of pulse skipping in subsequent cycles, which changes a frequency of energy pulses resulting in a portion of the light emitting elements being dimmer as more pulses are skipped.

FIG. 7 generally illustrates an example medical apparatus 700 that comprises a display, such as the display 100 disclosed above with respect to FIGS. 1A-3. In some embodiments, functional and operational aspects of the medical apparatus 700 are controlled through the combination of capacitive touch and light element illumination disclosed herein. For example, a laser handpiece 702 can be controlled using capacitive touch input of control objects on the display 100. In some embodiments, the medical apparatus 700 includes a manual control panel 704 that can be used to select one or more operational modes/parameters for the laser handpiece 702. This can generally include selecting pulse frequency, wavelength, power, and other attributes of a power source used to power the laser handpiece 702. Again, this medical apparatus 700 is merely a non-limiting example of an associated device that can be used in combination with the display 100 of the present disclosure.

As used herein, the term "engine", "system", "client", "module", "controller or microprocessor", or "application" may also refer to any of an application-specific integrated circuit ("ASIC"), an electronic circuit, a processor (shared, dedicated, or group) that executes one or more software or firmware programs, a combinational logic circuit, and/or other suitable components that provide the described functionality.

Figure 8:
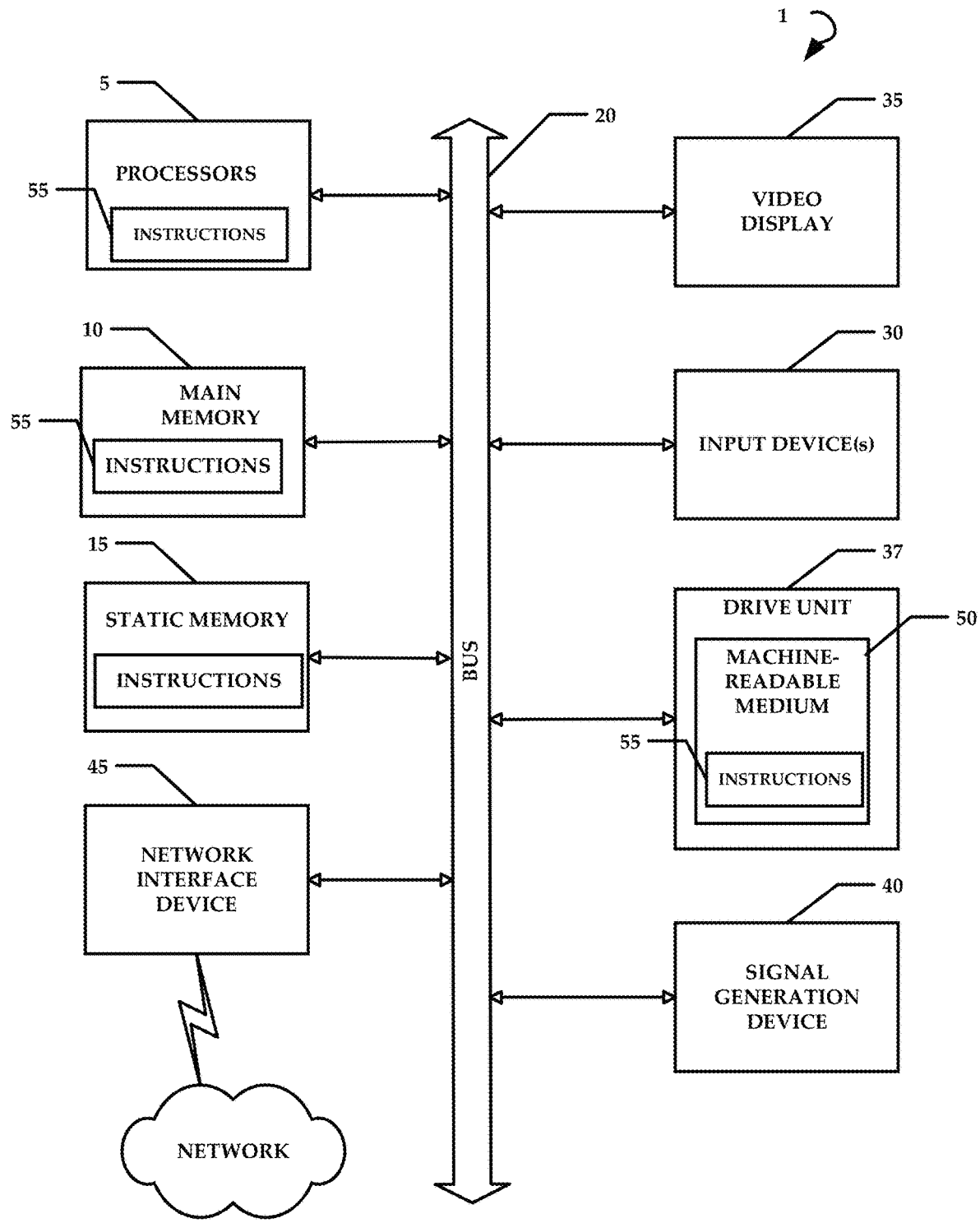
FIG. 8 is a schematic of an example computing device, all or portions of which can be used to practice aspects of the present disclosure.

FIG. 8 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a robotic construction marking device, a base station, a personal computer (PC), a tablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processors 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alphanumeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processors 5 during execution thereof by the computer system 1. The main memory 10 and the processors 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

Not all components of the computer system 1 are required and thus portions of the computer system 1 can be removed if not needed, such as Input/Output (I/O) devices (e.g., input device(s) 30). One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application, and to enable others of ordinary skill in the art to understand the present technology for various embodiments with various modifications as are suited to the particular use contemplated.

Aspects of the present technology are described above with reference to flowchart illustrations and/or block diagrams of methods, apparatus (systems) and computer program products according to embodiments of the present technology. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Bolt") may be interchangeably used with its non-capitalized version (e.g., "bolt"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "mechanically connected," etc., are used interchangeably herein to generally refer to the condition of being mechanically/physically connected. If any disclosures are incorporated herein by reference and such incorporated disclosures conflict in part and/or in whole with the present disclosure, then to the extent of conflict, and/or broader disclosure, and/or broader definition of terms, the present disclosure controls. If such incorporated disclosures conflict in part and/or in whole with one another, then to the extent of conflict, the later-dated disclosure controls.

The terminology used herein can imply direct or indirect, full or partial, temporary or permanent, immediate or delayed, synchronous or asynchronous, action or inaction. For example, when an element is referred to as being "on," "connected" or "coupled" to another element, then the element can be directly on, connected or coupled to the other element and/or intervening elements may be present, including indirect and/or direct variants. In contrast, when an element is referred to as being "directly connected" or "directly coupled" to another element, there are no intervening elements present.

Although the terms first, second, etc. may be used herein to describe various elements, components, regions, layers and/or sections, these elements, components, regions, layers and/or sections should not necessarily be limited by such terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Example embodiments of the present disclosure are described herein with reference to illustrations of idealized embodiments (and intermediate structures) of the present disclosure. As such, variations from the shapes of the illustrations as a result, for example, of manufacturing techniques and/or tolerances, are to be expected. Thus, the example embodiments of the present disclosure should not be construed as necessarily limited to the particular shapes of regions illustrated herein, but are to include deviations in shapes that result, for example, from manufacturing.

Any and/or all elements, as disclosed herein, can be formed from a same, structurally continuous piece, such as being unitary, and/or be separately manufactured and/or connected, such as being an assembly and/or modules. Any and/or all elements, as disclosed herein, can be manufactured via any manufacturing processes, whether additive manufacturing, subtractive manufacturing and/or other any other types of manufacturing. For example, some manufacturing processes include three dimensional (3D) printing, laser cutting, computer numerical control (CNC) routing, milling, pressing, stamping, extrusion, vacuum forming, hydroforming, injection molding, lithography and/or others.

Any and/or all elements, as disclosed herein, can include, whether partially and/or fully, a solid, including a metal, a mineral, a ceramic, an amorphous solid, such as glass, a glass ceramic, an organic solid, such as wood and/or a polymer, such as rubber, a composite material, a semiconductor, a nano-material, a biomaterial and/or any combinations thereof. Any and/or all elements, as disclosed herein, can include, whether partially and/or fully, a coating, including an informational coating, such as ink, an adhesive coating, a melt-adhesive coating, such as vacuum seal and/or heat seal, a release coating, such as tape liner, a low surface energy coating, an optical coating, such as for tint, color, hue, saturation, tone, shade, transparency, translucency, non-transparency, luminescence, anti-reflection and/or holographic, a photo-sensitive coating, an electronic and/or thermal property coating, such as for passivity, insulation, resistance or conduction, a magnetic coating, a water-resistant and/or waterproof coating, a scent coating and/or any combinations thereof.

Unless otherwise defined, all terms (including technical and scientific terms) used herein have the same meaning as commonly understood by one of ordinary skill in the art to which this disclosure belongs. The terms, such as those defined in commonly used dictionaries, should be interpreted as having a meaning that is consistent with their meaning in the context of the relevant art and should not be interpreted in an idealized and/or overly formal sense unless expressly so defined herein.

Furthermore, relative terms such as "below," "lower," "above," and "upper" may be used herein to describe one element's relationship to another element as illustrated in the accompanying drawings. Such relative terms are intended to encompass different orientations of illustrated technologies in addition to the orientation depicted in the accompanying drawings. For example, if a device in the accompanying drawings is turned over, then the elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the example terms "below" and "lower" can, therefore, encompass both an orientation of above and below. Additionally, components described as being "first" or "second" can be interchanged with one another in their respective numbering unless clearly contradicted by the teachings herein.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A transparent electroluminescent display, comprising:
   a first transparent layer comprising a first plurality of rows of traces, the first plurality of rows of traces coupled with light emitting elements, at least a portion of the light emitting elements being associated with control objects that allow a user to select operational settings for an associated device;
   a second transparent layer comprising capacitive touch elements that receive touch input from a user, the capacitive touch elements being associated with the control objects;
   a third transparent structural layer disposed between the first transparent layer and the second transparent layer; and
   a microprocessor configured to:
      receive touch input from the capacitive touch elements; and
      control illumination of the light emitting elements of the first transparent layer using a pulse skipping scheme applied to the first plurality of rows of traces so as to selectively illuminate the light emitting elements, in response to the touch input received from the capacitive touch elements.

2. The transparent electroluminescent display according to claim 1, wherein the microprocessor is further configured to selectively adjust an operational setting of the associated device in response to the touch input or an operational mode selected by the user from a control panel coupled to the transparent electroluminescent display.

3. The transparent electroluminescent display according to claim 2, wherein the microprocessor is configured to provide a plurality of operational modes that each comprise unique combinations of operational settings for a specific medical procedure, the settings being pre-configured, the pre-configured settings being displayed as selectable procedure options on the transparent electroluminescent display.

4. The transparent electroluminescent display according to claim 3, wherein a power of the operational settings is displayed within a selectable dial indicator displayed on the transparent electroluminescent display, the selectable dial indicator comprising power indicator dial increments that ring a central numerical power level value display.

5. The transparent electroluminescent display according to claim 1, further comprising a microprocessor that can selectively adjust a luminance of a portion of the light emitting elements by applying a pulse skipping scheme comprising positive and negative pulses to the portion of the first plurality of rows of traces at a specific voltage and at a frequency so as to illuminate only a portion of the light emitting elements required to display characters associated with a power level and a pulse width or duration, based on the touch input.

6. The transparent electroluminescent display according to claim 5, wherein the positive and negative pulses have a fixed pulse width and an adjustable frequency, further wherein a period of the positive and negative pulses are selectively controlled by the microprocessor, which effectively changes the frequency.

7. The transparent electroluminescent display according to claim 6, wherein the light emitting elements each comprise a conductive material that is deposited on the first transparent layer that is a glass substrate, wherein the conductive material is at least partially coated with a phosphor that illuminates when an electrical charge is applied.

8. The transparent electroluminescent display according to claim 7, wherein the microprocessor selectively dims a second portion of the light emitting elements using a pulse skipping scheme.

9. The transparent electroluminescent display according to claim 8, wherein the pulse skipping scheme allows for pulse skipping in subsequent cycles, which changes a frequency of energy pulses resulting in the second portion of the light emitting elements being dimmer as more pulses are skipped.

10. The transparent electroluminescent display according to claim 1, further comprising a microprocessor to selectively adjust a luminance of the light emitting elements by applying positive and negative pulses to an associated trace at a specific voltage and at a frequency.

11. The transparent electroluminescent display according to claim 1, wherein the capacitive touch elements comprise at least one of a conductive ink, carbon nanotubes, or a thin film, which are disposed within the second transparent layer that is a glass substrate.

12. A transparent electroluminescent display, comprising:
   a first transparent layer comprising a first plurality of rows of traces coupled with light emitting elements;
   a second transparent layer comprising a second plurality of rows of traces associated with capacitive touch elements embedded into the second transparent layer; and
   a microprocessor configured to:
      control illumination of the light emitting elements using a pulse skipping scheme applied to the first plurality of rows of traces so as to selectively illuminate the light emitting elements, based on touch input received from the capacitive touch elements of the second transparent layer.

13. The transparent electroluminescent display according to claim 12, further comprising a third transparent structural layer disposed between the first transparent layer and the second transparent layer.

14. The transparent electroluminescent display according to claim 12, wherein the capacitive touch elements are associated with control objects that are selectable using touch input.

15. The transparent electroluminescent display according to claim 12, wherein the second plurality of rows of traces are coupled with a ground plane and receive multi-touch or sliding touch input.

16. A transparent electroluminescent display, comprising:
   a rear transparent layer comprising light emitting elements;
   an intermediate transparent structural layer disposed on the rear transparent layer;
   a top transparent layer comprising capacitive touch elements that receive touch input; and
   a first microprocessor that receives the touch input from the capacitive touch elements and controls illumination of the light emitting elements in response to the touch input, and a second microprocessor that is configured to use a pulse skipping scheme applied to control the illumination of the light emitting elements.

17. The transparent electroluminescent display according to claim 16, wherein the first microprocessor is further configured to selectively adjust an operational setting of an associated device in response to the touch input or an operational mode selected by a user from a control panel coupled to the transparent electroluminescent display.

18. The transparent electroluminescent display according to claim 17, wherein the first microprocessor is configured to provide a plurality of operational modes that each comprise unique combinations of operational settings for a specific medical procedure, the settings being pre-configured, the pre-configured settings being displayed as selectable procedure options on the transparent electroluminescent display.

19. The transparent electroluminescent display according to claim 18, wherein a power of the operational settings is displayed within a selectable dial indicator displayed on the transparent electroluminescent display, the selectable dial indicator comprises power indicator dial increments that ring a central numerical power level value display.

20. The transparent electroluminescent display according to claim 16, wherein the capacitive touch elements comprise at least one of a conductive ink, carbon nanotubes, or a thin film, which are disposed within the top transparent layer that is a glass substrate.

* * * * *